US006873942B1

(12) United States Patent
Suga

(10) Patent No.: US 6,873,942 B1
(45) Date of Patent: Mar. 29, 2005

(54) 3-D STRUCTURE DESIGN SYSTEM, A METHOD FOR DESIGNING 3-D STRUCTURE AND A RECORDING MEDIUM READABLE BY A COMPUTER HAVING A PROGRAM ALLOWING THE COMPUTER TO EXECUTE THE METHOD RECORDED THEREIN

(75) Inventor: Osamu Suga, Tokyo (JP)

(73) Assignee: Original Engineering Consultants Co., Ltd., Tokyo (JP)

( * ) Notice: Subject to any disclaimer, the term of this patent is extended or adjusted under 35 U.S.C. 154(b) by 0 days.

(21) Appl. No.: 09/551,530

(22) Filed: Apr. 18, 2000

(30) Foreign Application Priority Data

Feb. 21, 2000 (JP) ........................................ 2000-042855

(51) Int. Cl.⁷ .......................... G06G 7/48; G06F 17/50; G06T 17/00; G09G 5/00
(52) U.S. Cl. .............................. 703/1; 703/6; 345/420; 345/848
(58) Field of Search ................................ 345/420, 848; 703/1, 6; 52/127.4, 126.6; 405/257, 267, 275

(56) References Cited

U.S. PATENT DOCUMENTS

| | | | | |
|---|---|---|---|---|
| 3,429,094 A | * | 2/1969 | Romualdi | 442/17 |
| 4,600,997 A | * | 7/1986 | Cain et al. | 702/5 |
| 4,744,044 A | * | 5/1988 | Stover et al. | 708/530 |
| 4,964,060 A | * | 10/1990 | Hartsog | 703/1 |
| 5,461,709 A | * | 10/1995 | Brown | 345/848 |
| 5,988,862 A | * | 11/1999 | Kacyra et al. | 703/6 |
| 6,272,447 B1 | * | 8/2001 | Gavin et al. | 703/1 |
| 6,295,544 B1 | * | 9/2001 | Cheung | 708/134 |
| 6,384,823 B1 | * | 5/2002 | Donoghue | 345/848 |

OTHER PUBLICATIONS

Frederick P. Brooks, "Walkthrough—A Dynamic Graphics System for Simulating Virtual Buildings", University of North Carolina, 1986, pp. 9–21.*

Dany Hajjar and Simaan AbouRizk, "Building a Special Purposes Simulation Tool For Earth Moving Operations", Proceedings of the 1996 Winter Simulation Conference. pp. 1313–1320.*

Kevin Ryan, Niamh Harty, "Supporting Choice and Evaluation in Preliminary Design", ACM 1990, pp. 809–818.*

* cited by examiner

Primary Examiner—Kevin J. Teska
Assistant Examiner—Dwin M. Craig
(74) Attorney, Agent, or Firm—Jacobson Holman PLLC

(57) ABSTRACT

3-D structure design system and method thereof capable of preparing drawings and performing quantity calculation at the same time, and largely eliminating troubles caused when designing a concrete structure by handling the design of concrete-made structures with a cubic 3-D data from the very beginning. The system comprising: data input device for inputting structure data; 3-D structural data search device for searching data on a portion between members and data on a connection between members on the basis of the input data on the concrete-made structure, checking an interference portion between members, aligning members through the result of rivaling between members, automatically adjusting the overlapping of members, and searching the input data on members as data conforming to the concrete structure; body quantities search device for calculation; and result display device for displaying/outputting a search result.

5 Claims, 6 Drawing Sheets

① Rectangular parallel piped    ② Column

③ Cylinder    ④ Trigonal prism

US 6,873,942 B1

3-D STRUCTURE DESIGN SYSTEM, A METHOD FOR DESIGNING 3-D STRUCTURE AND A RECORDING MEDIUM READABLE BY A COMPUTER HAVING A PROGRAM ALLOWING THE COMPUTER TO EXECUTE THE METHOD RECORDED THEREIN

BACKGROUND OF THE INVENTION

1. Field of the Invention

The present invention relates to a design system for designing a concrete-made 3-D structure comprising a floor, a wall and a ceiling, a method for designing the 3-D structure, and a recording medium which is readable by a computer and has a program recorded therein which allows the computer to execute the method. More particularly, the invention relates to a 3-D structure design system or the like which remarkably shortens the period of design and which allows accurate design drawings and quantity of the structure to be obtained by designing the concrete-made 3-D structure grasped as a cubic object from the very beginning and associating quantities calculation.

2. Description of the Prior Art

Conventionally, in the design of a concrete-made 3-D structure, a designer inputs a basic design drawing into a two dimension CAD system upon the request of a structure client and prepares detailed design drawings of the structure upon a request of the structure client through the two-dimension CAD system and manual work, and various kinds of quantities calculation are read and prepared from the drawings which have been prepared. Furthermore, in the case where the design is to be changed, after the information on the drawing which has been prepared by the 2-D CAD system is changed, various kinds of quantities calculation are performed again. Consequently, the drawing prepared by the 2-D CAD system is produced, and mathematical values are read with a man's eyes and transcribed on a separate sheet of paper so that the summing-up calculation is performed.

However, according to such a method, there arises a case in which the digital data of the 2-D CAD drawings are not reflected upon the quantities calculation and mathematical values indicated in the CAD drawings are not the same with the quantities calculation. In many cases, inaccurate quantities calculation forms are prepared with the result that there arises a problem that a considerable time is required for checking the values and correcting wrong values. In particular, in the case where a change is made in the design through a consultation with the structure client, there arises a case in which a large-scale correction work is required such as the correction of the CAD drawings, and the re-calculation of quantity values. This will lead to an increase in the design cost, a delay in the design period, and dissatisfaction with the result of the quantities calculation and as a result, confidence from the client will be lost. Furthermore, considerable experience and expertise are required for the check of the normal structure design. There is also a problem that a lot of time and labor are required to prepare products free from errors to be delivered to clients.

SUMMARY OF THE INVENTION

Therefore, an object of the present invention is to provide a 3-D structure design system and a method therefor in which a concrete-made structure is grasped from the step of a basic design as a 3-D cubic object, a burden of the designer along with a change in design is alleviated, a sufficient investigation is made as soon as possible, and, furthermore, the result of the quantities calculation is automatically obtained after the completion of the design of the structure, files can be shared with other design departments, and an attempt can be made to prevent errors in the design thereof.

According to the present invention, the above object is attained by providing a 3-D structure design system and a method therefor, the system comprising:

- data input means for inputting structure data with respect to the whole body of a concrete-made 3-D structure; and
- 3-D structural data search means for searching data on a portion between members and data on a connection between members on the basis of the input data on the concrete-made structure, checking an interference portion between members, aligning members through the check of the result of rivaling between members, automatically adjusting the overlapping of members and searching the input data on members as data conforming to the concrete-made structure;
- body quantities search means for calculating each of the quantities of concrete, forms, and timbering of the concrete-made structure; and
- result display means for displaying and outputting a search result of each means such as a sum total sheet or the like. Herein "rivaling" means to judge priority between two members of the same or different kind according to a predetermined priority order.

Furthermore, according to the present invention, the above object is attained by providing a 3-D structure design system and a method therefor, the system comprising:

- earth-work drawing input means for inputting data such as ground quality and inclination angle of a drilled normal surface or the like for automatically calculating the quantity of drilled ground and the quantity of the residual buried ground at the portion buried underground at the time of constructing a concrete-made structure by using data on the concrete-made structure; and
- earth-work quantities search means for searching quantity of drilled ground by displaying in a 3-D manner the drilled surface from data obtained by the earth-work drawing input means, decomposing the drilled surface into a square pole, a square cone, a triangle cone and circle cone, and a truncated cone to calculate volumes thereof, and searching the quantity of drilled ground, the quantity of the residual ground and the quantity of the buried ground by searching the volume of the concrete-made structure which comes under the ground surface on the basis of the external configuration of the concrete-made structure and the input data.

Furthermore, according to the present invention, the above object of the invention is attained by providing a 3-D structure design system and a method therefor, the system comprising:

- reinforcement data input means for inputting the number of reinforcements and a method of arrangement thereof required for each member in the concrete-made structure; and
- reinforcement quantity search means for searching the shape of reinforcement, the length of one reinforcement, and the number of reinforcements regarding all the members for which reinforcement arrangement is done on the basis of the information from the above method, preparing a bending list on the basis of the search result of the reinforcement data, and further calculating the diameter and the number of reinforcements required for the concrete-made structure, and the weight of the whole reinforcement.

A recording medium according to the present invention is such that an operation is realized with a computer by rendering a program readable by machine by recording the method in the program which is to be executed by the computer.

In this manner, the present invention has an advantage in that a 3-D structure design system, a method therefor as well as a recording medium which is readable by a computer and has a program recorded therein which allows the computer to execute the method are provided, the above system enabling the realization of the design of the concrete-made structure and the quantities calculation in a short time accurately and simply without experience and knowledge on a speciality on the reflection of the input data, the flexible handling of the change in the design, and a remarkable alleviation of a burden when designing the concrete-made structure.

DESCRIPTION OF THE PREFERRED EMBODIMENT

A 3-D structure design system according to the present invention and a method therefor will be explained on the basis of the accompanying drawings hereinafter.

Figure 1:
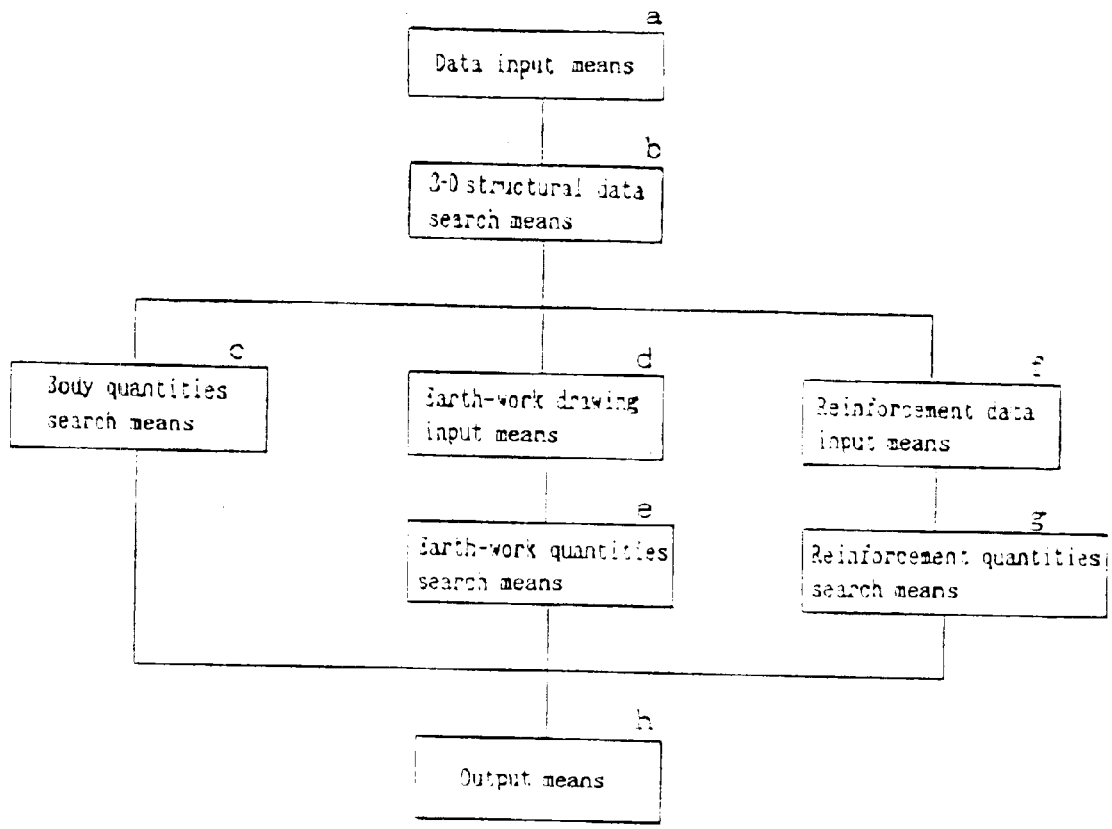
FIG. 1 is a block view for explaining a structure of a 3-D structure design system according to the present invention.
Figure 2:
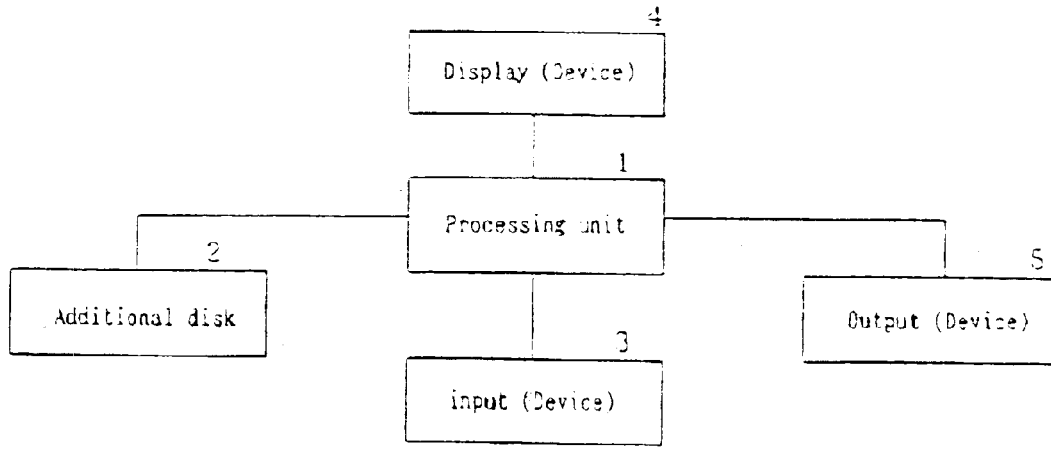
FIG. 2 explains a schematic structure of the 3-D structure design system according to the present invention.

As shown in FIG. 2, the 3-D structure design system basically comprises a processing unit (computer) 1 provided with a central processing unit, and memories such as a RAM (Random Access Memory) constituting an internal memory and a ROM (Read Only Memory), an additional disk 2 comprising a hard disk, a photo-electro-magnetic disk or the like, an input device 3 comprising a keyboard or the like, a display device 4 such as a color display device or the like comprising a CRT (Cathode Ray Tube) and an LCD (Liquid Crystal Display), and an output device 5 comprising a printer, a plotter or the like.

The above additional disk 2 memorizes various kinds of programs and various kinds of data required for processing each program, the programs allowing the processing unit 1 to serve as data input means, 3-D structural data search means, body quantities search means, earth-work drawing input means, earth-work quantities search means, reinforcement data input means, reinforcement quantities search means and search result display means or the like.

For example, in the processing unit 1, such a program of the 3-D structural data search means is memorized that not only searches the 3-D data of the structure based on inputted concrete-made structure data and recognize connection data between blocks to be connected, but also automatically judges interfering portion of one block with the other through the result of rivaling between blocks and adjusts the length and the width of the blocks.

Besides, in the processing unit 1, such a program of the body quantities search means is memorized that determines a volume and a surface area of each member and a volume of a space partitioned with the members on the basis of specifications peculiar to all the concrete structures searched by the program and other member data.

Furthermore, the above additional disk 2 memorizes whole structure of the concrete-made structure and the result of member quantity calculation, and such each kind of program and data are recorded on a recording medium such as, for example, a FD (Floppy Disk), a CD-ROM (Compact Disk Read Only Memory) or the like, so that the program and the data are read into the additional disk 2 via a reading device. Furthermore, the program and the data can be memorized in the additional disk 2 by directly inputting the program and data from the above input device 3.

Then, the processing unit 1 has a function of analyzing the structural data of the concrete-made structure on the basis of the program and data memorized in the additional disk 2, automatically calculating each of the quantities of concrete, forms and timbering, and obtaining the result conforming to the quantities on the design drawings.

Furthermore, the processing unit 1 has a function of recognizing the size of each member and the relationship between members on the basis of each data of the concrete-made structure input via the input device 3, and searching the constituent elements of the whole concrete-made structure, and a contact surface between members. Specifically, the processing unit 1 recognizes the coordinates of each member of the concrete-made structure, and searches an area of a portion that contacts other members.

Furthermore, the processing unit 1 has earth-work drawing input means for inputting ground quality data, the relationship between the concrete-made structure and a ground level, and earth-work data such as inclination of a drilled surface as well as earth-work quantities search means for searching the quantity of drilled ground on the basis of input earth-work data, and searching the volume quantity which is buried underground in the structure from data on the above concrete-made structure and data on the ground level. Here, the searched quantity of ground is handled as the quantity of residual ground, and the processing unit 1 also has a function of determining the quantity of the buried ground.

Furthermore, the processing unit 1 has reinforcement data input means for inputting required reinforcement data peculiar to each member of the concrete-made structure via the input device 3 and the reinforcement quantities search means for searching the length, the shape, the number and the weight of the reinforcement on the basis of the input reinforcement data. Furthermore, the processing unit 1 has a function of displaying on and outputting on the display device 4 a 3-D model drawing of the concrete-made structure. Furthermore, the reading device has a function of reading a program memorized in recording mediums such as a FD), a CD-ROM or the like into the additional disk 2 via the processing unit 1 on the basis of the program for reading which the program is memorized in the additional disk 2.

The recording medium according to the present invention is a recording medium such as a FD, a CD-ROM or the like in which a program is recorded for allowing the 3-D structure design system (a computer) to serve as the above data input means, the 3-D structural data search means, body quantities search means, earth-work drawing input means, earth-work quantities search means, reinforcement data input means, reinforcement quantity search means including the preparation of the design drawing, and result display means for displaying the result thereof.

Hereinbelow, there will be explained one preferred embodiment of a method for searching the quantity of the concrete-made structure, and for searching the earth-work and reinforcement processing with the 3-D structure design system.

Figure 3:
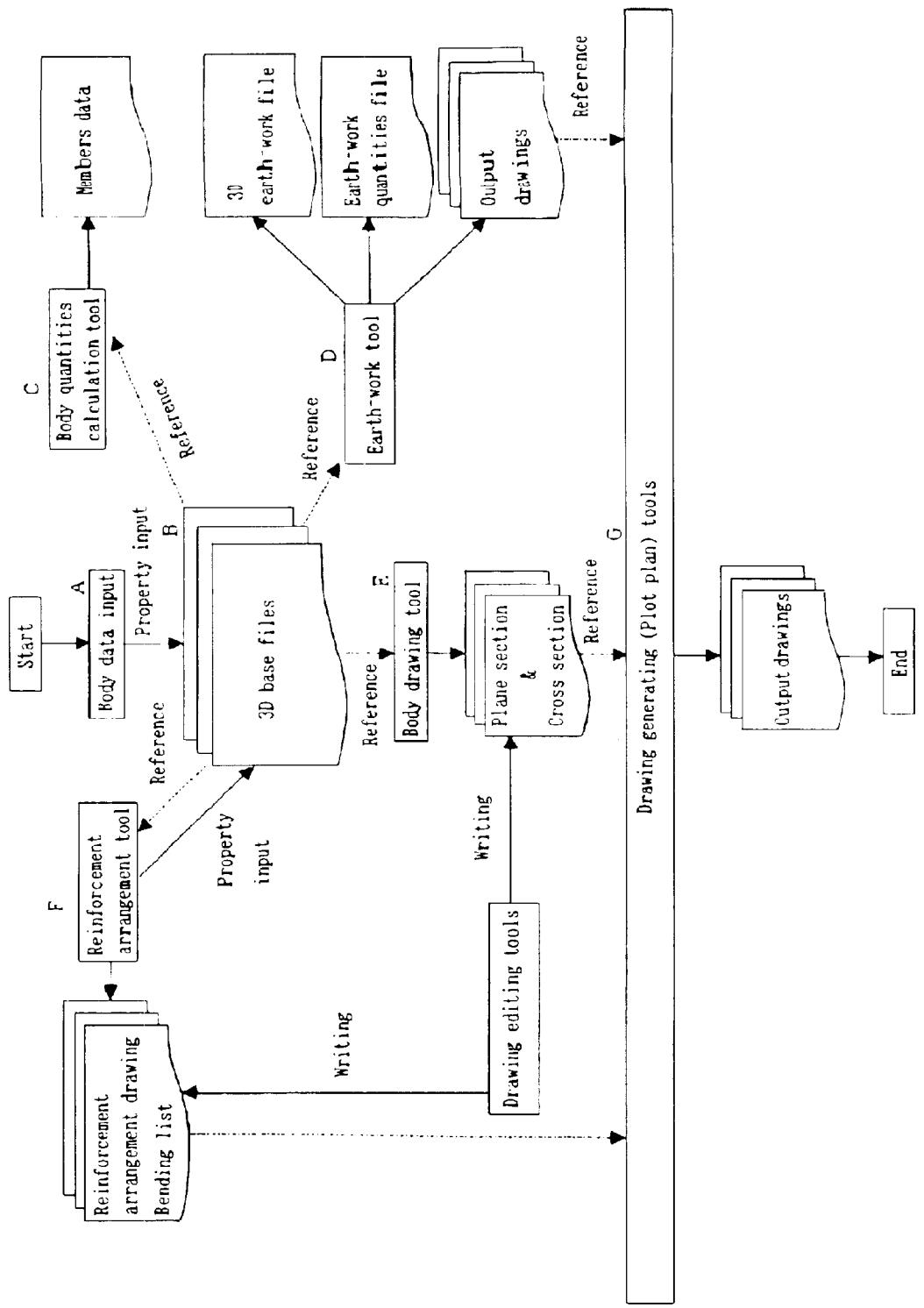
FIG. 3 is a flowchart for designing a concrete-made structure according to one embodiment of the present invention.

FIG. 3 is a flowchart showing a main flow of a design of the concrete-made structure by the 3-D structure design system.

In the 3-D structure design system according to the embodiment, the members data of the concrete-made structure is input in the beginning (step A), the 3-D model in the concrete-made structure is searched on the basis of data on the input concrete-made structure (step B), and the quantities of the 3-D model of the searched concrete-made structure is searched on the basis of the size of each member of the 3-D model thereof and the connection data between the members (step C).

Subsequently, the earth-work quantities are searched by inputting the earth-work drawings on the basis of the 3-D model of the concrete-made structure (step D), and furthermore, an arbitrary sectional drawing is prepared on the basis of the 3-D model of the concrete-made structure (step E). Furthermore, the diameter and the number of required reinforcements peculiar to each member are input on the basis of the 3-D model of the concrete-made structure and the reinforcement processing and the quantity of the reinforcement are searched (step F) to display the design data of the concrete-made structure as a result.

The data of the concrete-made structure is input (step A) by displaying an instruction for requesting, for example, the input of the whole body, and operating the input device in accordance with the instruction. As data of the concrete-made structure, on the basis of the size of the bottom slab member, data on the size and the position of the wall and an opening of the slab is input in addition to the size of the column, the wall, the beam, the slab and the hunch for each of the steps.

Thus, upon the input of the data on the concrete-made structure, the 3-D model of the concrete-made structure is prepared based on the data (step B). Furthermore, the members data and the connection data of the concrete-made structure are searched, and each of the quantities of the concrete, forms and timbering for each member is searched (step C).

Figure 4:
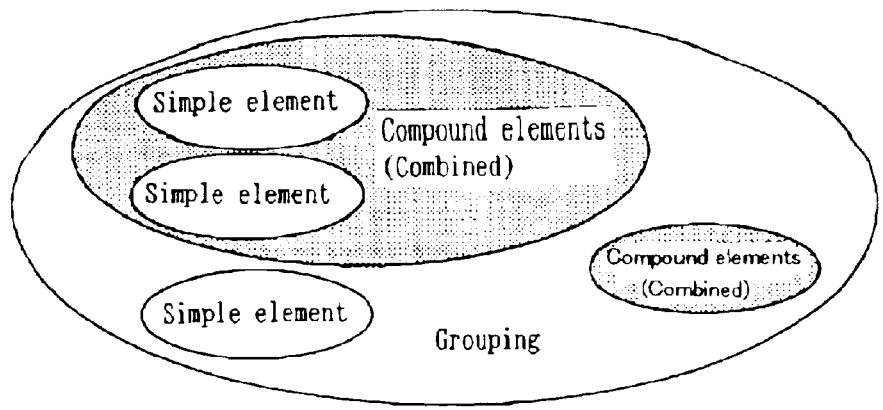
FIG. 4 is a model view of elements in the 3-D structure design system.
Figure 5:
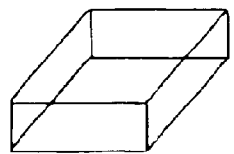
FIG. 5 is an explanation view showing a basic shape of a block.
Figure 5:
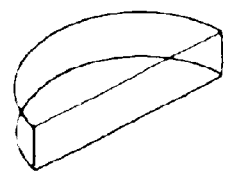
Figure 5:
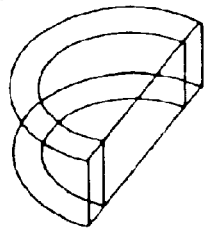
Figure 5:
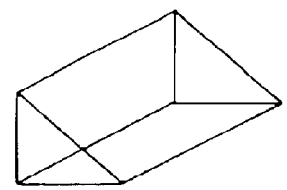
Figure 6:
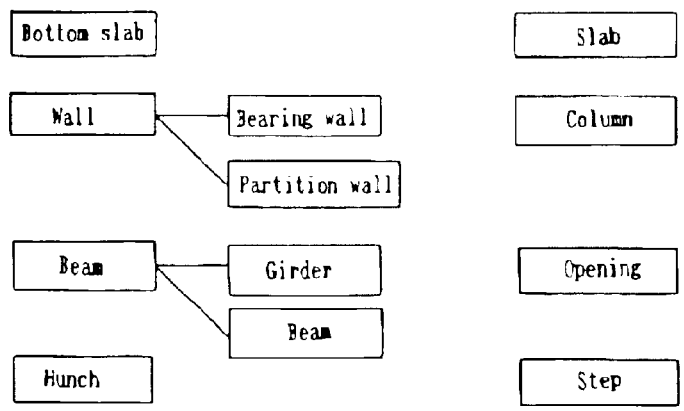
FIG. 6 is an explanation view showing a member's tree structure.
Figure 7:
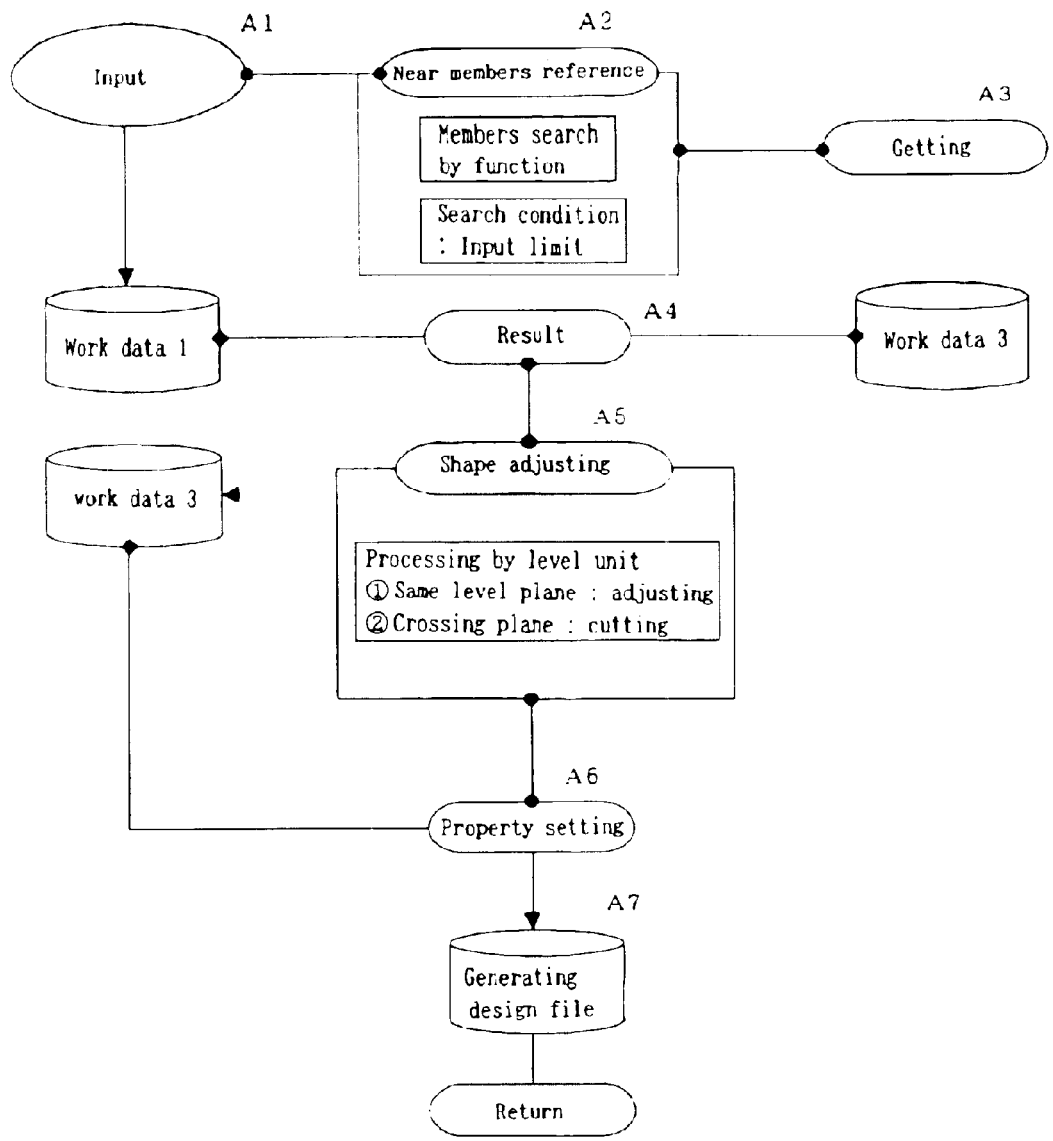
FIG. 7 is a flowchart for the generation of a design file.

The input data of the structure are specifically classified into elements shown in FIG. 4. Line segments, circles, and polygons serve as a simple element. This is the smallest unit of elements. The collection of a plurality of these simple elements corresponds to a compound element. For example, when a rectangular parallelopiped is input, the upper surface, a rectangle of the bottom surface and a collection of the line segments connecting each of the apexes thereof form a compound element which is referred to as a solid element. As a basic shape, modeling is executed by the input of four kinds of basic shapes such as 1) a rectangular parallelopiped, 2) a column, 3) a cylinder and 4) a trigonal prism. The kind of members and the generation tree are shown in FIG. 6. Furthermore, as shown in FIG. 7, upon the completion of the input of the data (step A), adjacent members are searched (step A2), so that the search member is obtained (step A3). On the basis of the acquisition of data on the members, respective members are rivaled each other (step A4), the shapes of the negative members are changed (step A5), the attribute thereof is set (step A6), and the design file is generated (step A7). Designing the above members data file is made by preparing the members data (Table 1) including the connection state of each member object. The content comprises four sections: <basic data>, <members data>, <bevel data>, and <connection data>. The <members data>, the <bevel data>and the <connection data>form a tree structure.

TABLE 1

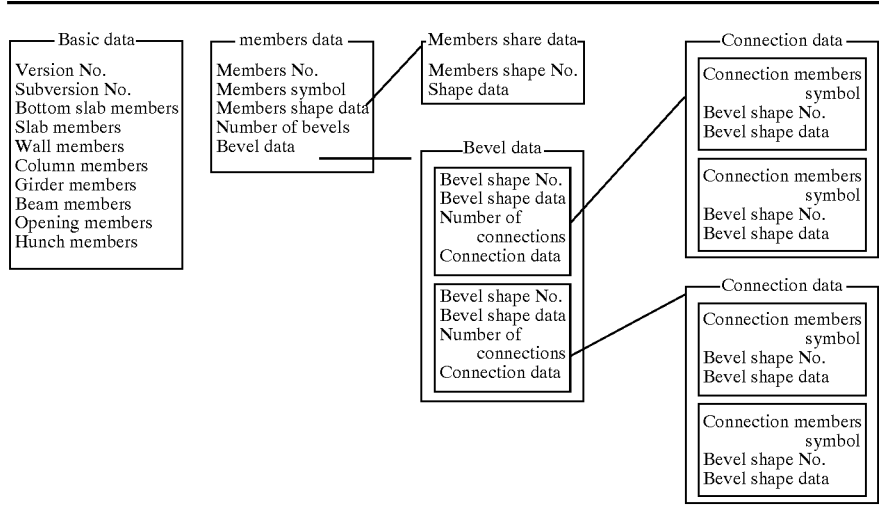

TABLE 1-continued

| | |
|---|---|
| <basic data> | data throughout the whole design |
| <member data> | data on the member unit which constitutes the core of member. <member shape data> and <connection data> derive fron here. |
| <member shape data> | data on the member shape which are divided into 2 groups and at least one thereof exists in <member data> |
| <connection data> | data connected to each bevel of the member is accommodated per bevel for the number of bevel of the member which is to be connected |
| <bevel data> | the shape of the bevel is stored. |

Figure 8:
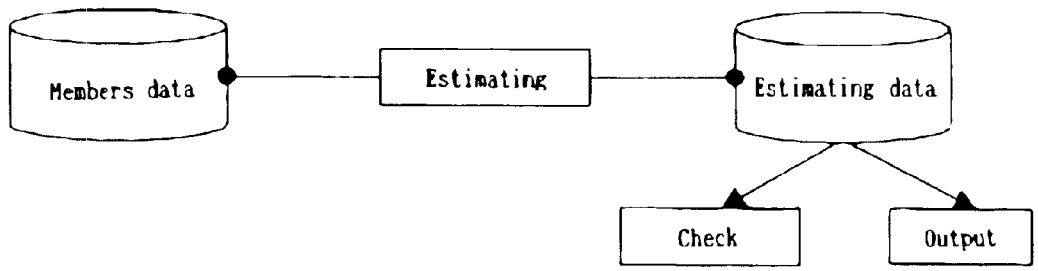
FIG. 8 is an estimating flowchart.

When the design file of the concrete-made structure is prepared, the quantities calculation is determined from the estimating flowchart shown in FIG. 8. The drilling shape and the drilled quantity are searched when the ground quality, the inclination of the drilled surface, and the ground level (the height of the ground surface) are designated. Also, volume of a buried, underground portion of concrete-made structure, thereby searching quantity of residual ground and buried ground. Furthermore, the plane drawing and the sectional drawing are prepared (step E). When the diameter and the number of the required reinforcement peculiar to the member are input, the shape and the length of the reinforcement are searched after the relationship between connection data of the members is judged (step F).

Figure 9:
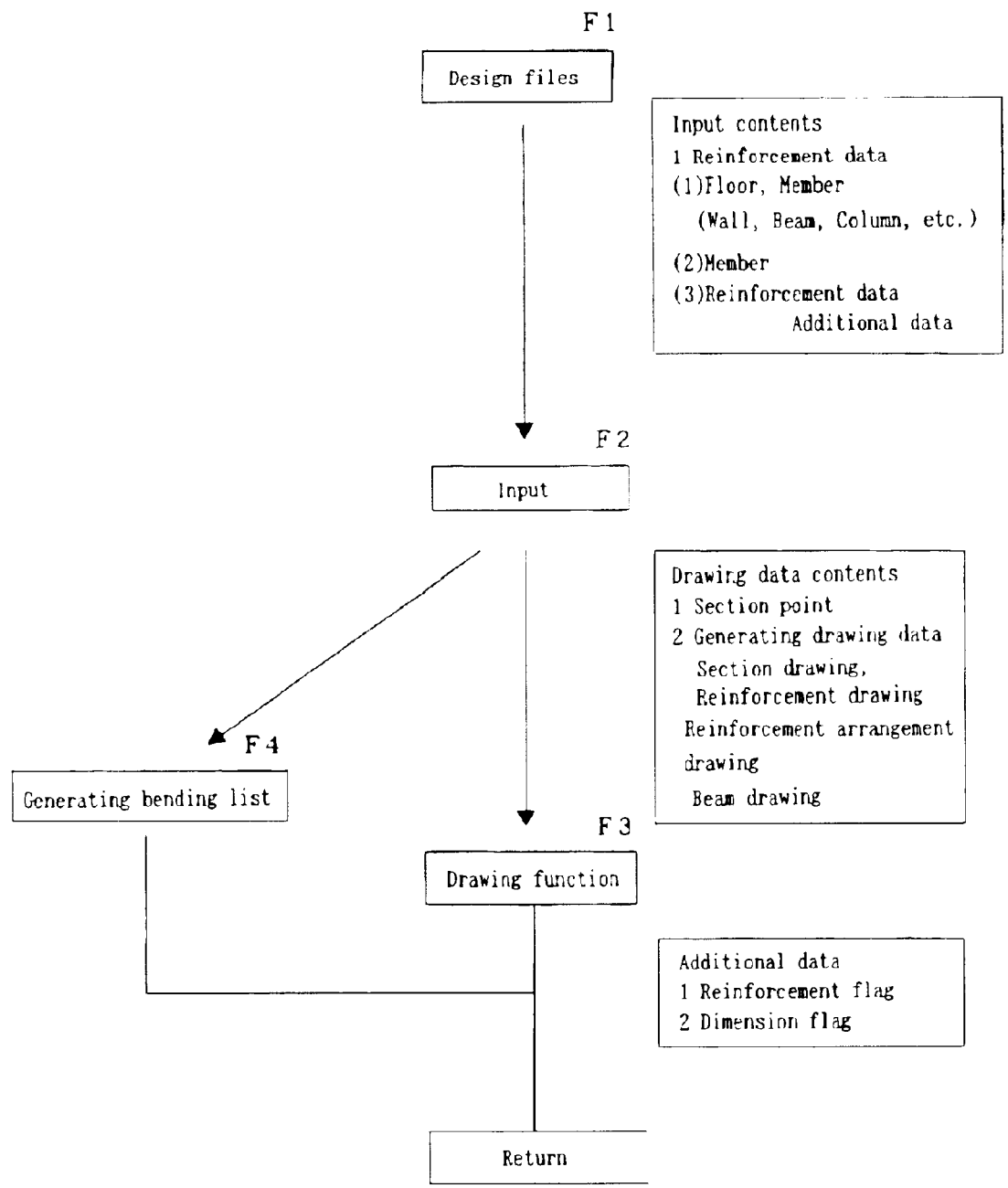
FIG. 9 is a flowchart for the arrangement of a reinforcement.
Figure 10:
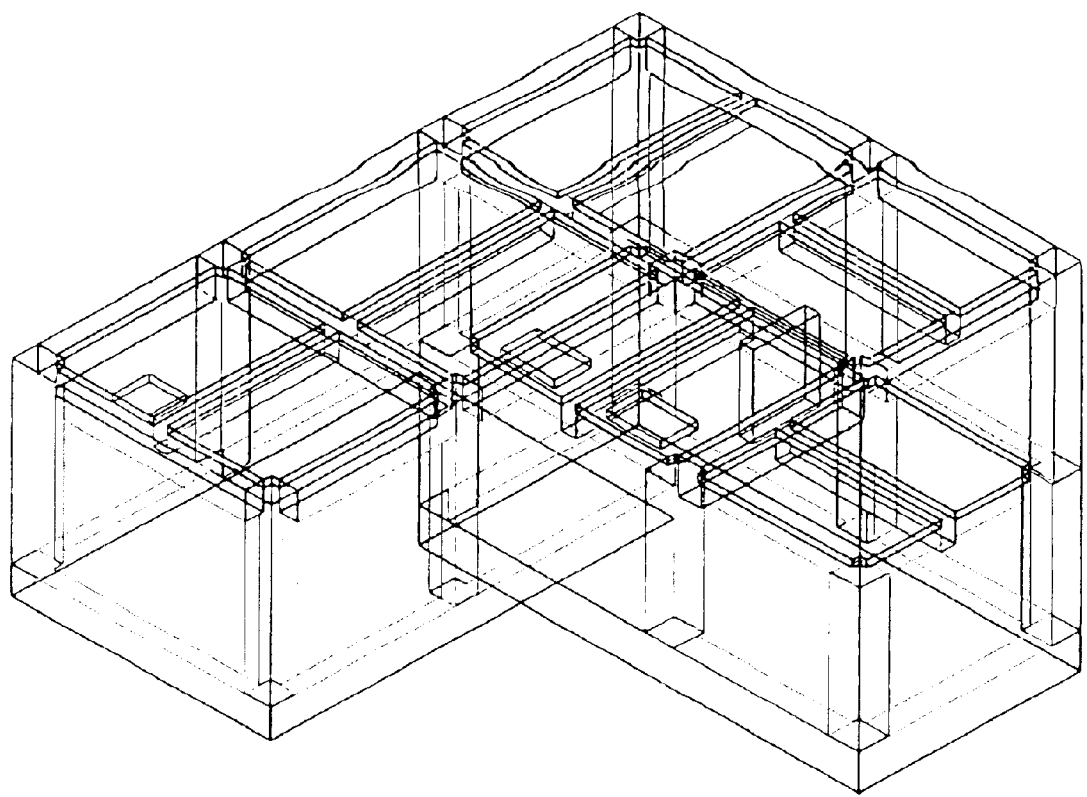
FIG. 10 is an output drawing of a design file which is prepared by using the 3-D structure design system according to the present invention.

FIG. 9 is a reinforcement arrangement drawing and a flowchart of the quantities calculation. On the basis of the design file (step F1) of the concrete-made structure, the reinforcement data for each member is either input or input corrected (step F2). Then a drawing is prepared in which the reinforcement arrangement and the reinforcement data is described (step F3). Furthermore, the reinforcement processing table is prepared with the reinforcement data. FIG. 10, Table 2, Table 3 and Table-4 show a modeling view of the 3-D structure design system and an example of an output form.

TABLE 2

Members data [S3(Slab)]

| Member ID 1 | 20 | Member shape: Travers (Slab) senser |
|---|---|---|
| Member ID 2 | 0 | |
| Member No. | 3 | |
| Opening (0:No 1:3e) | 0 | |

0: Construction members  1: Building members

| | x | y | z | (x coordinate, y coordinate, z coordinate) |
|---|---|---|---|---|
| 1 | 3.71 | 11.25 | 3.80 | |
| 2 | 8.51 | 11.25 | 3.80 | |
| 3 | 8.51 | 11.25 | 4.00 | |
| 4 | 3.71 | 11.25 | 4.00 | |
| 5 | 3.71 | 10.96 | 3.30 | |
| 6 | 3.71 | 11.25 | 3.30 | |
| 7 | 3.71 | 11.25 | 4.00 | |
| 8 | 3.71 | 13.96 | 4.00 | |

Param[0] 4.80   Param[1] 2.70   Param[2] 0.20
Param[0] 0.00   Param[4] 4.00
Number of bevel 10 bevels
Bevel type ID 1 (polygon) forms calculation for bevel 1

TABLE 2-continued

Members data [S3(Slab)]

| | x | y | z | (x coordinate, y coordinate, z coordinate) |
|---|---|---|---|---|
| 1 | 3.51 | 11.25 | 3.80 | |
| 2 | 3.71 | 11.25 | 3.80 | |
| 3 | 3.71 | 10.75 | 3.80 | |
| 4 | 3.91 | 10.75 | 3.80 | |
| 5 | 3.91 | 10.98 | 2.80 | |
| 6 | 4.31 | 10.96 | 3.80 | |
| 7 | 4.31 | 13.75 | 3.80 | |
| 8 | 3.51 | 13.75 | 3.80 | |

Bevel type ID 1 (polygon) forms calculation for bevel 0

| | x | y | z | (x coordinate, y coordinate, z coordinate) |
|---|---|---|---|---|
| 1 | 8.51 | 11.25 | 4.00 | |
| 2 | 3.71 | 11.25 | 4.00 | |
| 3 | 3.71 | 13.75 | 4.00 | |
| 4 | 0.91 | 13.75 | 4.00 | |
| 5 | 0.91 | 10.96 | 4.00 | |
| 6 | 8.01 | 10.98 | 4.00 | |
| 7 | 8.01 | 13.75 | 4.00 | |
| 8 | 8.51 | 13.75 | 4.00 | |

Bevel type ID 1 (polygon) forms calculation for bevel 1

| | x | y | z | (x coordinate, y coordinate, z coordinate) |
|---|---|---|---|---|
| 1 | 8.51 | 11.25 | 3.80 | |
| 2 | 0.71 | 11.25 | 3.80 | |
| 3 | 0.71 | 11.25 | 4.00 | |
| 4 | 8.51 | 11.25 | 4.00 | |

1st connection bevel <B7> (polygon)

| | x | y | z | (x coordinate, y coordinate, z coordinate) |
|---|---|---|---|---|
| 1 | 3.71 | 11.25 | 4.00 | |
| 2 | 8.51 | 11.25 | 4.00 | |
| 3 | 8.51 | 11.25 | 3.80 | |
| 4 | 3.71 | 11.25 | 3.80 | |

Bevel type ID 1 (polygon) forms calculation for bevel 1

| | x | y | z | (x coordinate, y coordinate, z coordinate) |
|---|---|---|---|---|
| | 3.71 | 11.25 | 3.80 | |
| 2 | 3.71 | 13.75 | 3.80 | |

TABLE 3

| Name | Calculation rule | | Quantities | Unit |
|---|---|---|---|---|
| S3(Slab) | | | | |
| Concrete | 4.80 + 2.70 + 0.20 | Formula 1 | 2.59 | m³ |
| | −1.00 + 1.50 + 0.20 | [Opening] | −0.30 | |
| Total | | | 2.29 | m³ |
| Forms | 2.70 + 4.80 | Formula 1 | 12.96 | m² |
| | +4.80 + 0.20 | | 0.96 | |
| | +2.50 + 0.20 + 2 places | | 1.00 | |
| | +0.20 + 0.20 + 4 places | | 0.16 | |
| | +4.40 + 0.20 | | 0.88 | |
| | +1.50 + 0.20 + 2 places | | 0.60 | |
| | +1.00 + 0.20 + 2 places | | 0.40 | |
| | −4.80 + 0.20 | (B7) | −0.96 | |
| | −0.20 + 2.50 | (W5) | −0.50 | |
| | −0.20 + 0.20 | (C5) | −0.04 | |
| | −0.20 + 0.20 | (C5) | −0.04 | |
| | −4.40 + 0.20 | (W4) | −0.88 | |
| | −0.20 + 0.20 | (C4) | −0.04 | |
| | −0.20 + 0.20 | (C4) | −0.04 | |
| | −2.50 + 0.20 | (W3) | −0.50 | |
| Total | | | 13.96 | m² |
| Timbering | 2.70 + 4.80 + 4.00 | | 51.84 | m³ |
| Total | | | 51.84 | m³ |

TABLE 4

Total Quantity list

Reinforced concrete

| Name | Concrete (m²) | Forms (m²) | Timbering (m²) |
|---|---|---|---|
| F2 | 72.00 | 36.00 | |
| S1 | 1.98 | 9.90 | 39.60 |
| S2 | 1.98 | 9.90 | 39.60 |
| S3 | 2.29 | 13.96 | 61.34 |
| S12 | 2.20 | 13.48 | 49.92 |
| #1 | 10.56 | 40.00 | |
| #2 | 10.08 | 38.40 | |
| #3 | 12.96 | 48.00 | |
| #4 | 10.56 | 40.00 | |
| #5 | 12.96 | 48.00 | |
| #6 | 10.08 | 38.40 | |
| C2 | 2.56 | 7.92 | |
| C3 | 2.56 | 7.92 | |
| C4 | 2.56 | 7.92 | |
| C5 | 2.56 | 7.92 | |
| C6 | 2.56 | 7.23 | |
| C7 | 2.56 | 7.29 | |
| B1 | 2.64 | 9.44 | 10.56 |
| B1 | 1.44 | 7.20 | 7.20 |
| B7 | 1.64 | 7.68 | 7.68 |
| Total | 168.63 | 406.50 | 206.40 |

As has been described above, the 3-D structure design system, a method therefor, and a recording medium having the method recorded therein can be appropriately changed within the scope of not deviating from the gist of the present invention without being limited by the above embodiment. For example, the method can be used in the case where the concrete-made structure exists over two places.

What is claimed is:

1. A 3-D structure design system for designing a concrete-made structure comprising a floor, a wall and a ceiling, the system comprising:
   data input means for consecutively inputting structure data classified into various kinds of blocks with such shapes as a rectangular parallelopiped, a column, a cylinder, a trigonal prism on the basis of structural characteristics of the structure starting with a bottom portion of the structure;
   3-D structure data search means for judging priority according to a predetermined priority order between rivaling or virtually crossing blocks which are input by the data input means, fitting the block of a lower priority to suitable shape, and calculating respective areas of connection planes of the connected blocks;
   body quantities search means for searching data to calculate quantity of the concrete-made structure from the data on the 3-D structure search means and, at the same time, for calculating quantity of concrete formworks and timbering for each block;
   result display means for displaying/outputting the search result of each of the above means;
   3-D earth-work drawing input means for inputting data of ground level, ground quality, and inclination of drilled normal surface to search drilled surface conforming to the concrete-made structure and searching quantity of drilled ground and an arbitrary section shape thereby searching the volume of the buried portion of the concrete-made structure; and earth-work quantities search means for searching the quantity of the buried ground and the quantity of the residual ground from the data of the earth-work drawing input means.

2. The 3-D structure design system according to claim 1, further comprising:

reinforcement data input means for inputting diameter and number of reinforcements required for respective blocks on the basis of data of the concrete-made structure input by the system of claim 2; and reinforcement quantities search means for searching the shape of reinforcement such as length, number and weight of the reinforcements in the whole concrete-made structure or each block portion from the reinforcement data in the reinforcement data input means and preparing a design drawing at a required section portion.

3. A method for designing a concrete-made 3-D structure comprising a floor, a wall and a ceiling, the method comprising:

data input step of inputting structure data classified into various kinds of blocks with such shapes as a rectangular parallelopiped, a column, a cylinder and trigonal prism on the basis of structural characteristics of the structure starting with a bottom portion of the structure;

3-D structural data search step of judging priority according to a predetermined priority between rivaling or virtually crossing blocks which are input by the data input means, fitting the block of lower priority to suitable shape, and calculating respective areas of connection planes of the connected blocks;

body quantities search step of searching data to calculate quantity of the concrete-made structure from the 3-D structure data search step and at the same time to calculate quantity of the concrete formworks and timbering for each block;

result display step of displaying/outputting the result of each of the above steps;

earth-work drawing input step of inputting data of ground level, ground quality, and inclination of drilled normal surface to search drilled surface conforming to the concrete-made structure and searching quantity of drilled ground and an arbitrary sectional shape thereby searching the volume of buried portion of the concrete-made structure; and earth-work quantities search step of searching the quantity of the buried ground and the quantity of the residual ground from data on the earth-work drawing input step.

4. The method for designing the 3-D structure according to claim 3, further comprising:

reinforcement data input step of inputting the diameter and the number of reinforcements peculiarly required for the members for each block on the basis of each data on the concrete-made structure searched by the method of claim 5; and reinforcement quantity search step of searching the reinforcement configuration such as the length, the number, the weight or the like of reinforcement in the whole concrete-made structure or each block portion with the reinforcement information at the reinforcement data input step.

5. A recording medium readable by a computer characterized by comprising a program described therein which allows a computer to execute a method according to claim 3.

* * * * *